United States Patent
Goethals et al.

(10) Patent No.: US 8,968,864 B2
(45) Date of Patent: Mar. 3, 2015

(54) SEALED POROUS MATERIALS, METHODS FOR MAKING THEM, AND SEMICONDUCTOR DEVICES COMPRISING THEM

(71) Applicants: IMEC, Leuven (BE); Universiteit Gent, Ghent (BE)

(72) Inventors: Frederik Goethals, Evergem (BE); Pascal Van Der Voort, Wilrijk (BE); Isabel Van Driessche, Waasmunster (BE); Mikhail Baklanov, Veltem-Beisem (BE)

(73) Assignees: IMEC, Leuven (BE); Universiteit Gent, Ghent (BE)

( * ) Notice: Subject to any disclaimer, the term of this patent is extended or adjusted under 35 U.S.C. 154(b) by 82 days.

(21) Appl. No.: 13/622,141

(22) Filed: Sep. 18, 2012

(65) Prior Publication Data

US 2013/0075876 A1   Mar. 28, 2013

Related U.S. Application Data

(60) Provisional application No. 61/538,431, filed on Sep. 23, 2011.

(51) Int. Cl.
| | |
|---|---|
| *B32B 3/26* | (2006.01) |
| *H01L 23/58* | (2006.01) |
| *H01L 21/31* | (2006.01) |
| *H01L 21/3105* | (2006.01) |
| *H01L 21/02* | (2006.01) |

(52) U.S. Cl.
CPC ...... *H01L 21/31058* (2013.01); *H01L 21/3105* (2013.01); *H01L 21/02126* (2013.01); *H01L 21/02203* (2013.01); *H01L 21/02362* (2013.01)
USPC .................. 428/316.6; 428/315.5; 428/315.7; 257/642; 257/E21.26; 257/E23.12; 438/763

(58) Field of Classification Search
USPC ................. 428/315.5, 315.7, 316.6; 257/642, 257/E21.26, E23.12; 438/763
See application file for complete search history.

(56) References Cited

U.S. PATENT DOCUMENTS

| | | | | |
|---|---|---|---|---|
| 8,441,006 | B2* | 5/2013 | Michalak et al. | ............... 257/40 |
| 2005/0020074 | A1 | 1/2005 | Kloster et al. | |
| 2006/0108320 | A1 | 5/2006 | Lazovsky et al. | |
| 2010/0109201 | A1* | 5/2010 | Fletcher et al. | ............... 264/334 |
| 2011/0163424 | A1 | 7/2011 | Lazovsky et al. | |

* cited by examiner

*Primary Examiner* — Hai Vo
(74) *Attorney, Agent, or Firm* — Knobbe, Martens, Olson & Bear, LLP (57) ABSTRACT

A method for at least partially sealing a porous material is provided, comprising forming a sealing layer onto the porous material by applying a sealing compound comprising oligomers wherein the oligomers are formed by ageing a precursor solution comprising cyclic carbon bridged organosilica and/or bridged organosilanes. The method is especially designed for low k dielectric porous materials to be incorporated into semiconductor devices.

19 Claims, 9 Drawing Sheets

SEALED POROUS MATERIALS, METHODS FOR MAKING THEM, AND SEMICONDUCTOR DEVICES COMPRISING THEM

CROSS-REFERENCE TO RELATED APPLICATIONS

This application claims the benefit under 35 U.S.C. §119 (e) of U.S. provisional application Ser. No. 61/538,431, filed Sep. 23, 2011, the disclosure of which is hereby expressly incorporated by reference in its entirety and is hereby expressly made a portion of this application.

FIELD OF THE DISCLOSURE

Methods for sealing a porous material are provided, more specifically, methods for sealing porous low-k materials for semiconductor manufacturing. Sealed porous materials are also provided, in particular sealed porous low-k dielectric materials. Semiconductor devices comprising sealed porous materials, in particular sealed porous low-k dielectric materials are also provided.

BACKGROUND OF THE DISCLOSURE

The manufacturing of various electronic devices (including but not limited to for example, microprocessors, storage devices, graphic processors, analog to digital converters, digital to analog converters, signal processors, image processors, etc.) now requires the cost-effective production of very small structures and features, e.g., structures and features having a characteristic dimension at the micrometer or nanometer size scale. This manufacturing includes the formation of electrically conductive material(s) (e.g., aluminum, copper, etc.) and electrically insulating dielectric material(s) (e.g., silicon dioxide, silicon nitride, etc.) on or as part of a substrate. Moreover, the electrically conductive material(s) are typically separated by regions of dielectric material(s) so as to define electrical elements (e.g., transistors, capacitors, etc.) and interconnections between such electrical elements.

Many electronic devices include multiple layers of electrical elements and/or interconnections (e.g., interconnect layer(s)). Each interconnect layer comprises conductive material(s) separated by dielectric material(s). As an example, a first layer of dielectric material is formed on an electrically conductive material (first conductive layer). A second layer of dielectric material is formed on the first layer of dielectric material. Trenches (e.g. lines) are formed in the second layer of dielectric material, and vias (e.g., holes) are then formed in the first layer of dielectric material. Electrically conductive material is subsequently formed in the trenches and vias so as to electrically connect the now electrically conductive trenches (second conductive layer) to the electrically conductive material (first conductive layer) through the now electrically conductive vias.

High performance microelectronic devices are obtained by the continuous downscaling of their critical dimensions. However, this downscaling also leads to an increase in RC-delay and cross talk which adversely affects the performance of the device. To reduce this delay, the dielectric constant of the low k-material that insulates the interconnect wiring has to decrease. The decrease in dielectric constant will also lead to a lower power consumption of the device. A key factor to decrease the k-value drastically is introducing porosity into the electrically insulating dielectric material because air has a dielectric constant of 1 which is the lowest value that can be obtained. However, a huge problem with porous dielectric materials and especially for mesoporous dielectric materials (pore sizes from 2 to 50 nm) is that moisture, chemical solvents and/or metal particles can diffuse into the pores leading to an high increase in k-value and leakage current.

Therefore, pore sealing technologies are essential for the implementation of mesoporous structures as low-k materials. A known sealing method is a plasma treatment of the porous low-k material which creates a densification at the surface of the low-k material. However, plasma treatments can also cause a change in structure, composition and porosity of the material. Moreover, mesoporous films are sensitive for diffusion of reactive components which means that plasma treatment might affect the quality of the bulk porous material as well. A known alternative is the deposition of a dense layer via chemical vapor deposition (CVD) or atomic layer deposition (ALD). Pore sizes smaller than 2 nm can be sealed by plasma treatment, CVD and ALD. Among the drawbacks of these techniques are the diffusion of the barrier into the pores and the fact that current dielectric barriers have a relatively high dielectric constant. Molecular self-assembly is a technique that can be used to produce very small structures having a dimension at the nanometer size scales. Molecular self-assembly can be used to produce a variety of material formations, such as molecular monolayers (often referred to as self-assembled monolayers, or SAMs), molecular multilayers and nanostructures (e.g., nanotubes, nanowires). For example, a SAM has been used as a barrier layer (replacing the deposited barrier layer) that inhibits diffusion of copper into a dielectric material. However, this SAM inhibits copper diffusion into $SiO_2$ or fluorinated $SiO_2$, both of which are non-porous dielectric materials. Porous dielectric materials provide additional challenges to inhibiting diffusion because the pores of porous dielectric materials provide another diffusion pathway for foreign material (e.g., barrier layer material, copper) into the dielectric material. SAMs have been proposed for use as bulk diffusion barrier layers, especially for use with dense dielectric materials such as silicon dioxide. There is a need in the art for preventing diffusion of foreign material through the exposed pores of porous dielectrics.

However advanced nano-electronics are presently developing materials for 22 nm technology nodes and beyond. In this case the dielectric constant of the interlayer dielectrics must be smaller than 2.0. Such ultra low-k materials generally have a porosity exceeding 50% and a pore size of 3 nm or more. Here the existing sealing technologies are no longer efficient.

Therefore is desirable to have a method to at least partially seal the pores of a porous material, in particular a porous low-k dielectric material, without the drawbacks of the state of the art. More specifically, new strategies for sealing pores larger than 3 nm are urgently needed.

SUMMARY OF THE DISCLOSURE

In a first aspect, a method is provided for at least partially sealing a porous material or layer, the method comprising: providing said porous material, forming a sealing layer on the porous material by applying a sealing compound comprising oligomers, wherein the oligomers are formed by ageing a precursor solution comprising cyclic carbon bridged organosilica and/or bridged organosilanes.

In the following description it should be understood that any one of the embodiments below may be combined at will with another embodiment of the first aspect.

In an embodiment of the first aspect, the cyclic carbon bridged organosilica are tri-silacyclohexanes such as, but not limited to, $[SiCH_2(OEt)_2]_3$, $[SiCH_2]_3(OEt)_5CH_2Si(OEt)_3$ and combinations or mixtures thereof in any proportions.

In another embodiment of the first aspect, the bridged organosilane may be $(EtO)_3SiRSi(OEt)_3$ with R being one of $CH_2$, $CH_2CH_2$, $CH=CH$, or phenylene.

In another embodiment of the first aspect, the method may further comprise, after forming the sealing layer, the step of performing a thermal treatment, for instance by submitting the combination of the porous layer and the sealing, layer to heat.

In an embodiment of the first aspect which is particularly suitable for making or producing semiconductor devices, the porous material may be a low-k or ultra low-k dielectric material, for instance a dielectric material with a k value from about 1.8 to 3.6.

In another embodiment of the first aspect, the porous material may comprise pores having a dimension (e.g. a diameter) larger than 2 nm, or at least 3 nm, and up to 50 nm, for instance up to 25 nm.

In another embodiment of the first aspect, the sealing compound may be applied by a spin-on technique.

In another embodiment of the first aspect, the precursor solution comprising cyclic carbon bridged organosilica and/or bridged organosilanes may further comprise water, an acid, and/or a solvent, each of them being as described in more details below.

In another embodiment of the first aspect, the concentration of carbon bridged organosilica and/or bridged organosilanes and the ageing conditions (such as, but not limited to, ageing time, ageing temperature, etc.) may be selected to obtain a sealing compound having a viscosity between 1 and 3 cP (centipoises).

In another embodiment of the first aspect, ageing of the precursor solution may be performed for an ageing time of at least 12 hours, and up to about 200 hours, depending upon parameters such as, but not limited to, the ageing temperature, the concentration of the carbon bridged organosilica and/or the bridged organosilane in the solvent(s) and so on.

In another embodiment of the first aspect, the method may further comprise applying one or more post-treatment steps after forming the sealing layer onto the porous material.

For instance one post-treatment step may be a step having the effect of making the sealing layer more hydrophobic in order to improve the sealing power, e.g. completely sealing or blocking the pores of the sealing layer.

In an embodiment of the first aspect, one post-treatment step may be performed by exposing the assembly of layers obtained after forming the sealing layer (3) to an end-capping compound comprising hydrophobic groups such as hexamethyldisilazane (HDMS- or trimethylsilane (TMS) or any other silanol end-capping compound comprising hydrophobic groups as detailed below, e.g. a chlorotrialkylsilane.

In another embodiment of the first aspect, one post-treatment may be selected to create functional groups on the surface of the sealing layer, e.g. grafting, prior to another process step.

In another embodiment of the first aspect, a subsequent process step may be an Atomic Layer Deposition step, and the functional groups created by such step may be hydroxyl (OH) groups.

In a second aspect, an at least partially sealed porous material or layer is provided comprising: a first layer of a porous material having pores with a dimension from 2 nm to 50 nm, and a sealing layer overlying and in physical contact with the first layer, wherein the sealing layer comprises oligomers with a cyclic carbon bridged structure and with pores having a dimension smaller than or equal to 0.6 nm.

An at least partially sealed porous layer is also provided in a second aspect comprising: a first layer of a porous material having pores with a dimension larger than 2 nm, and a sealing layer overlying and in physical contact with the first layer, wherein the sealing layer comprises oligomers formed by ageing a precursor solution comprising cyclic carbon bridged organosilica and/or bridged organosilanes and with pores having a dimension not above 0.6 nm.

In an embodiment of the second aspect, the sealing layer may have a k value comprised between about 1.8 and 3.6, for instance comprised between about 2.8 and 3.5, or comprised between about 1.8 and 2.2.

BRIEF DESCRIPTION OF THE DRAWINGS

All drawings are intended to illustrate some aspects and embodiments. The drawings described are only schematic and are non-limiting.

DETAILED DESCRIPTION OF ILLUSTRATIVE EMBODIMENTS

The present disclosure describes a method for pore sealing of a porous layer by applying a sealing solution comprising oligomers to form a sealing layer. Additionally the method can comprise a thermal treatment applied after forming the sealing layer.

In various embodiments, the porous layer may comprise/consist a mesoporous material, i.e. a material containing pores with diameters between 2 and 50 nm.

In different embodiments, the porous layer may comprise/consist a low-k dielectric material such as currently used in semiconductor manufacturing. Throughout this disclosure a low-k dielectric material is a material having a dielectric constant smaller than that of silicon oxide ($k_{SiO2}$=3.9).

In various embodiments, the sealing layer formed comprises pores having a diameter not above 0.6 nm, for instance from 0.1 to 0.6 nm. Such a sealing layer is suitable to be used in semiconductor manufacturing as a protective layer of the low-k material (e.g. low-k mesoporous material) during the further process steps (e.g. barrier deposition such as a copper barrier or a barrier of another electrically conductive material). Consequently a third aspect relates to a semiconductor device comprising an at least partially sealed porous material or layer as described in any one of the above embodiments of the second aspect, or an at least partially sealed porous material or layer obtained by a method as described in any one of the above embodiments of the first aspect.

The semiconductor device of the third aspect may further a copper barrier or a barrier of another electrically conductive material. Copper is commonly used as the electrically conductive material in electronic devices. Copper can be used to fill trenches and/or vias (or other, similar features) of an electronic device. A description of a method for forming a copper interconnection between electrical elements formed in or on a substrate (e.g. semiconductor) follows. The formation of a copper interconnection etches a structure (e.g., trenches and/or vias) in a dielectric material (e.g., silicon dioxide). A barrier layer (e.g., tantalum and/or tantalum nitride) is formed on the dielectric material. The barrier layer prevents diffusion of copper into the dielectric material. The barrier layer should also adhere well to the dielectric material and to the copper subsequently formed on the barrier layer. A seed layer of copper is formed on the barrier layer. Copper is then formed to fill the trench or via using a bulk formation process (e.g., an electrochemical deposition process).

The formation of copper interconnects includes two copper formation steps and because copper formed using the bulk copper formation process does not nucleate and/or adhere well on the formed barrier layer. This necessitates the formation of a copper seed layer, using a process other than a bulk formation process, on which the bulk copper does nucleate and/or adhere, for example, by providing an electrochemically reactive layer for subsequent electrochemical deposition of copper. Additionally, the two copper formation steps and are used because the copper seed layer formation step by itself (e.g., physical vapor deposition, sputtering) does not adequately fill the vias and trenches because of non-conformal step coverage produced by the physical vapor deposition process (e.g., breadloafing or excessive overhang of deposited material at the top of a trench, via or other feature).

In an alternative process or method for forming a copper interconnection between electrical elements formed in or on a substrate (e.g. semiconductor), the seed layer can be a material (e.g. ruthenium, platinum, etc.) other than copper on which copper formed using the bulk copper formation process does nucleate and/or adhere well (e.g., electrochemical deposition). In another variant, the barrier layer formed can be a material like ruthenium on which copper can be satisfactorily formed (e.g. with good nucleation and/or adhesion) during the bulk formation so as to eliminate the need for the copper seed layer.

The sealing layer is compatible with semiconductor manufacturing, preferably does not substantially penetrates the pore structure of the porous material underneath (e.g. low-k mesoporous material) and can be coated as thin as several nanometers. An additional advantage is the low dielectric constant of the sealing layer.

Some embodiments of certain embodiments describe performing additionally a post-treatment step after the sealing layer has been formed and eventually after the sealing layer has been thermally treated to form a complete hydrophobic sealed surface.

The method provides applying (e.g. by spin coating) a sealing compound comprising oligomers on a porous material. The porous material can be formed on a substrate.

The sealing layer formed with the method of certain embodiments may have a k value of about 2.8 to 3.6 both in the as-deposited, as well as in the thermally treated (baked) form, being itself a low-k material and thus perfectly compatible with semiconductor manufacturing and facilitating therefore the process integration.

An additional advantage is that it can be spin coated, a simple and cost-effective deposition method that can be performed under ambient atmosphere.

The sealing layer of certain embodiments may have a thickness in the range of several nanometers, for instance lower than 10 nm. However, depending on the semiconductor application type, thicker layers up to tens of nanometers may be deposited if required.

In a first aspect a method for at least partially sealing a porous material is described, comprising forming a sealing layer onto the porous material by applying a sealing solution comprising oligomers wherein the sealing solution is formed by ageing a precursor solution comprising cyclic carbon bridged organosilica and/or bridged organosilanes.

The at least partially sealing referred to in the various embodiments is a sealing process whereby the sealing layer does not penetrate the pores of the porous material and whereby the sealing layer comprises narrow pores suitable to protect the porous material in different situations. One of these applications is semiconductor manufacturing wherein such a sealing layer protects the low-k material (porous material) during the subsequent manufacturing steps (e.g. barrier deposition).

Optionally, by suitable post-treatment as disclosed further herein, a substantially complete sealing can be achieved, whereby the narrow pores of the sealing layer are blocked by functional groups.

In different embodiments, the cyclic carbon bridged organosilica are tri-silacyclohexanes such as $[SiCH_2(OEt)_2]_3$, $[SiCH_2]_3(OEt)_5CH2Si(OEt)_3$ and combinations or mixtures thereof.

In other embodiments, the bridged organosilanes are $(EtO)_3SiRSi(OEt)_3$ with R being one of $CH_2$, $CH_2CH_2$, $CH=CH$, or phenyl.

In various embodiments the porous material is a low-k dielectric material. A low-k dielectric material is a dielectric material having a dielectric constant lower than the dielectric constant of silicon dioxide (3.9). The low-k material can be deposited by spin-on techniques or chemical vapor deposition (CVD) techniques.

In various embodiments the porous material comprises pores having a dimension larger than 0.6 nm, preferably larger than 2 nm and more preferably at least 3 nm. Porous materials with a pore dimension larger than 2 nm and up to 50 nm are also referred to as mesoporous materials in the art.

The sealing layer is formed by coating/depositing of the sealing solution onto the porous material. The oligomer formation prior to coating (deposition) prevents its diffusion into the open pore structure. Further the sealing layer is dried at temperatures below 200° C. in air or baked at a higher temperature in an inert atmosphere (e.g. nitrogen, argon and the like).

Preferably the sealing solution is a liquid characterized by a certain viscosity.

The sealing solution can be applied by spin-on techniques.

Alternatively the sealing solution can be applied by dip-coating or inkjet printing. The latter has the advantage of a local coating/deposition.

Figure 1:
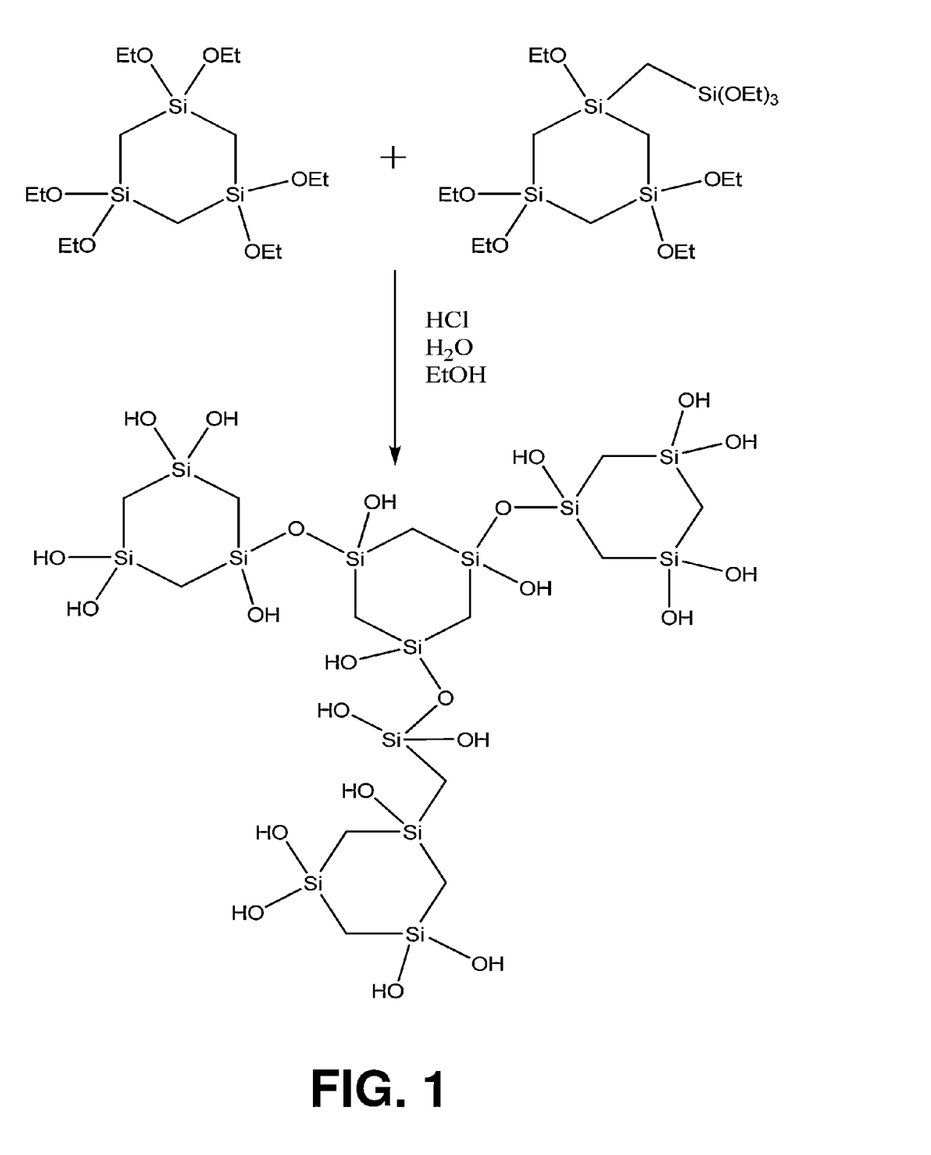
FIG. 1 illustrates schematically the oligomer formation from cyclic carbon bridged organosilane precursors according to embodiments.

The sealing solution is formed by ageing a precursor solution comprising cyclic carbon bridged organosilica and/or bridged organosilanes as precursors. These precursors may be synthesized according to a method described by Goethals et al. in J. Mater. Chem. (2010) 20:1709-1716. FIG. 1 illustrates schematically the oligomer formation from cyclic carbon bridged organosilane precursors in an embodiment.

The concentrations of the precursors as well as the ageing conditions (time and temperature) are preferably selected such that the viscosity of the sealing solution is about 1.0 to 3.0 cP (mPa·s) at the temperature of coating (e.g. at room temperature, 20° C.).

Higher viscosities lead to thicker sealing layers which may be less suitable for semiconductor manufacturing.

Furthermore, the precursor solution may comprise water, an acid and/or a solvent. The acid catalyzes the hydrolysis and it should be miscible with the solvent. Preferably an acid is selected so that is volatile below 100° C. under atmospheric pressure. In particular embodiments, the acid may be an inorganic acid such as, but not limited to, hydrochloric acid, or an organic acid.

The solvent may be suitably selected such that it is volatile below 100° C. under atmospheric pressure and miscible with water and the acid selected. Preferably, the solvent can be an organic solvent such as, but not limited to, an alcohol or a ketone or a mixture thereof wherein the precursors are soluble. In particular embodiments the solvent may be ethanol. In particular embodiments, the concentration of acid and the amount of water may be selected such that the precursors do not polymerize under the current ageing conditions. In other words, the concentration of acid and the amount of water may be selected such that the precursors do not form insoluble polymers under the ageing conditions. Preferably, the concentration of acid and the amount of water may be selected in such a way that only soluble polymers and oligomers are formed.

Preferably, only oligomers are formed.

Figure 2:
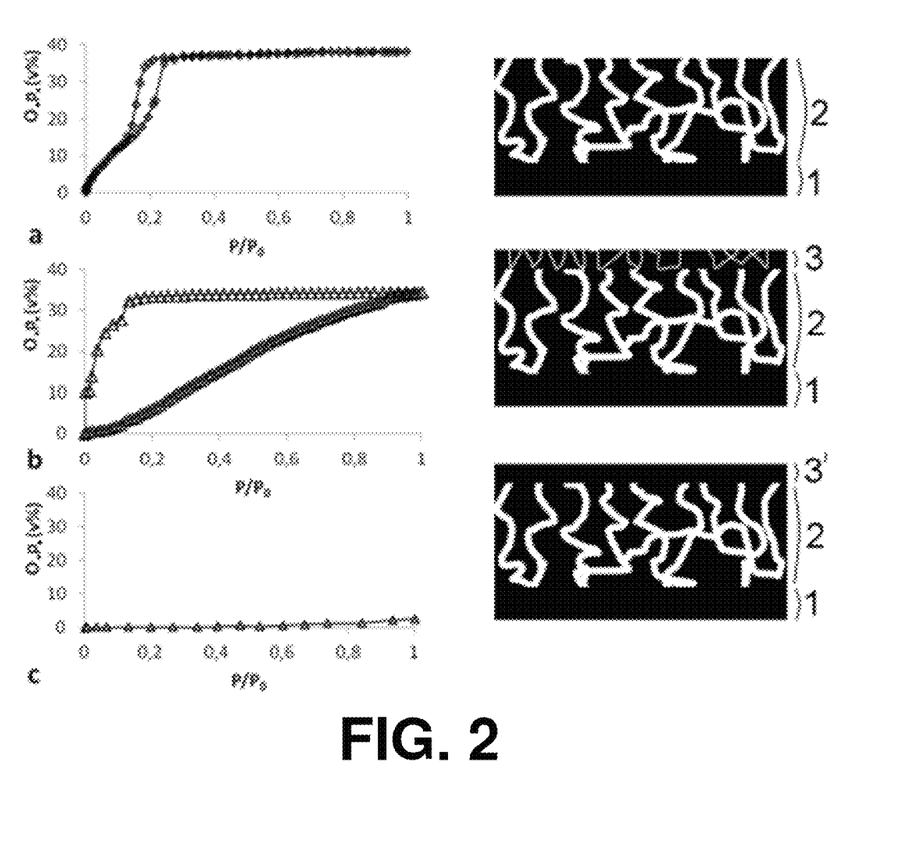
FIG. 2 shows the toluene adsorption/desorption isotherms (left) of the schematically represented stacks (right): (a) porous material (2) on a substrate (1); (b) sealing layer according to the method of the disclosure (3) on the porous material (2) on a substrate (1); (c) a treated (HDMS) sealing layer according to the method of the disclosure (3') on the porous material (2) on a substrate (1).

As shown schematically in FIG. 2 (a, right) the porous material (2) can be formed on a substrate (1). In different embodiments the substrate is made of any material compatible with semiconductor manufacturing, such as but not limited to a silicon wafer. Alternatively, for applications in other fields than semiconductor manufacturing the substrate can be made of any material, a metal, an insulator a semiconductor, plastics etc.

The sealing layer formed with the method of certain embodiments is also a porous material, however the pores dimension of the sealing layer are usually below about 0.6 nm, which makes it suitable for use as a protective layer for a (meso)porous material in different electronic applications. The pores of the sealing layer having a dimension below 0.6 nm are also referred to as narrow pores. This is illustrated by the schematically represented stack in FIG. 2 (b, right), wherein the sealing layer (3) is shown on top of a porous material (2) formed on a substrate (1).

In other specific embodiments the ageing conditions of the precursor solution can be varied from about 12 hours to about 1 week or 200 hours at room temperature (about 20° C.). However by increasing the temperature to values higher than the room temperature but lower than the boiling point of the solvent (e.g. 78° C. for ethanol) the ageing time can be reduced to about 90 minutes or even below. Specific non-limiting examples are herein further disclosed.

In various embodiments the method further comprises, after forming the sealing layer, performing a thermal treatment (also referred to as bake/baking step).

The thermal treatment can be performed at temperatures below 200° C. in air or at higher temperature (up to 600° C.) in inert atmosphere. Alternatively the sealing layer can be dried at room temperature in air. By drying or performing the thermal treatment the volatiles in the sealing layer are removed and the condensation of the cyclic carbon bridged organosilane is complete. Complete condensation means that remaining free silanol groups, present in the layer, will form Si—O—Si bonds when they are close enough for reaction.

In embodiments the method may further comprise a post-treatment applied after forming and drying/baking the sealing layer.

In particular embodiments the post-treatment applied may make the sealing layer hydrophobic thereby blocking the narrow pores of the sealing layer to achieve a complete sealing of the porous material underneath. This is illustrated by the schematically represented stack in FIG. 2 (c, right), wherein the post-treated sealing layer (3') is shown on top of a porous material (2) formed on a substrate (1).

In embodiments, the post-treatment for making the sealing layer hydrophobic may be performed with a silanol end-capping compound comprising hydrophobic groups. In embodiments, said silanol end-capping compound comprising hydrophobic groups may be suitable for silylation of silanol. In embodiments, said silanol end-capping compound comprising hydrophobic groups may be suitable for trialkylsilylation (e.g. trimethylsilylation) of silanol.

A first illustrative group of suitable silanol end-capping compounds comprising hydrophobic groups are compounds of the structural formula $R_nSiX_{4-n}$ wherein n is from 1 to 3 when X is not OR' and wherein n is from 0 to 3 when X is OR', each R is independently selected from saturated hydrocarbyl groups (such as, but not limited to, $C_{1-4}$ alkyl (e.g. methyl, ethyl, isopropyl or tert-butyl) or aromatic hydrocarbyl groups such as, but not limited to, aryl (e.g. phenyl), and each X is independently a group suitable for reacting with a silanol group such as, for example, Cl, I, Br, CN, $NR'_2$, $OSO_2CF_3$ and OR' wherein R' is a $C_{1-4}$ alkyl group (e.g. methyl or ethyl).

Examples of compounds belonging to this first illustrative group include, but are not limited to, trimethylchlorosilane, bromotrimethylsilane, iodotrimethylsilane, trimethylsilyl trifluoromethanesulfonate, trimethylsilyl cyanide, dimethylamino-trimethylsilane, triethylchlorosilane, isopropyldimethylchlorosilane, triisopropylchloro-silane, tert-butyldiphenylchlorosilane, phenyldimethylchlorosilane, diphenyltetramethyldisilazane, dimethyldichlorosilane, diethyldichlorosilane, tretraorthosilane, and methyltriethoxysilane.

A second illustrative group of suitable silanol end-capping compounds comprising hydrophobic groups are compounds represented by the structural formula $R'_3SiR''SiR'_3$ wherein R'' is a $C_{1-4}$ alkylene (e.g. methylene or ethylene) or an arylene (e.g. phenylene) divalent group and wherein each R' is independently selected from $C_{1-4}$ alkyl (e.g. methyl, ethyl, isopropyl or tert-butyl) and $C_{1-4}$ alkoxy (e.g. methoxy or ethoxy) groups.

Examples of compounds belonging to this second illustrative group include, but are not limited to, 1,2-bis(triethoxysilyl)ethane; 1,2-bis(triethoxysilyl)methane; 1,2-bis(triethoxysilyl)benzene; and 1,2-bis(trimethoxysilyl)ethane.

A third illustrative group of suitable silanol end-capping compounds comprising hydrophobic groups are compounds of the structural formula $R_3Si$—NH—$SiR_3$ or cyclic compounds of the structural formula $[SiR_2NH]_3$ wherein each R is as defined above.

Examples of compounds belonging to this third illustrative group include, but are not limited to, hexamethyldisilazane, diphenyltetramethyldisilazane, and hexamethylcyclotrisilazane.

A fourth illustrative group of suitable silanol end-capping compounds comprising hydrophobic groups are cyclic carbon bridged organosilica as defined for the precursor solution of any embodiment.

As used herein, and unless provided otherwise, the term "hydrophobic group" relates to groups able to increase the hydrophobicity of a given substrate and in particular of a $SiO_2$ substrate. For instance, hydrophobic groups can be hydrocarbon groups (e.g. alkyl groups) or halocarbon groups.

In specific embodiments, the post-treatment for making the sealing layer hydrophobic may be performed with hexamethyl disilazane (HDMS), trimethyl silane (TMS), chlorotrialkyl silanes or any equivalent thereof.

In alternative embodiments the thermal treatment and/or the post-treatment may be selected to create functional groups on the surface of the sealing layer prior to a subsequent process step. Examples of functional groups are the OH groups formed before an Atomic Layer Deposition (ALD) process step, such as ALD barrier deposition on a sealed porous material. Such OH groups can also for instance be present at the surface of the sealing layer as the result of the non-performance of a thermal treatment after formation of the sealing layer. The performance of a thermal treatment will typically diminish the amount of OH groups present. In general, a longer thermal treatment and/or a thermal treatment at a higher temperature will lead to less OH groups present.

In a second aspect an at least partially sealed porous layer is described comprising: a first layer of a porous material having pores with a dimension larger from 2 nm to 50 nm, and a sealing layer overlying and in physical contact with the first layer, wherein the sealing layer comprises oligomers with a cyclic carbon bridged structure and/or a bridged organosilane structure with pores having a dimension smaller than or equal to 0.6 nm.

In embodiments, the sealing layer may have a k value comprised between 2.8 and 3.6, more preferably between 3.0 and 3.4, both in the as-deposited as well as thermally treated (baked) or post-treated form. These values are comparable with other low-k materials and much lower than the k value of the state of the art sealing materials, which makes it suitable for protecting low-k material with large pores in semiconductor manufacturing.

The sealing layer of certain embodiments may further comprise functional groups which more completely block the pores of the sealing layer, thereby completely sealing the porous material of the first layer. In embodiments, the functional groups blocking the pores may be obtainable by end-capping silanol groups on the sealing material by using silanol end-capping compounds comprising hydrophobic groups as defined in any embodiment of the first aspect.

The present disclosure will be described further with respect to particular embodiments and with reference to certain drawings but the disclosure is not limited thereto. In the description provided herein, numerous specific details are set forth.

However, it is understood that embodiments may be practiced without these specific details. In other instances, well-known methods, structures and techniques have not been shown in detail in order not to obscure an understanding of this description.

In a specific embodiment a mesoporous silica material with an average pore diameter of 3.5 nm and a thickness of 80 nm was prepared as (meso)porous thin film material.

The total and open porosity of the mesoporous film is shown in Table 1 and was determined with spectroscopic ellipsometry and ellipsometric porosimetry (using toluene as adsorbent) respectively.

As employed herein, the term "open porosity" refers to the volume of the pores (as percentage of the total volume of the porous material) which are accessible for toluene, while the "total porosity" refers to the volume of the pores (as percentage of the total volume of the porous material) which are both accessible and not accessible for toluene.

Examples

Preparation of a Mesoporous Silica Film 0.3 g of Brij™ 76 (a polyoxyethylene stearyl ether porogen template) was dissolved in 20 ml ethanol and 0.5 ml (0.1M) HCl. Then 1 ml of tetraethylorthosilicate (TEOS) and 0.5 ml $H_2O$ were added to the solution followed by aging the solution for 1 day. The solution was then spin coated on a Si-wafer at a rate of 5000 rpm. The porogen template was removed by treating the film at 400° C. for 5 h.

Preparation of Cyclic Carbon-Bridged Organosilanes

A solution of 70 ml 0.5 w % $FeCl_3$ in dry tetrahydrofuran (THF) was added to 7 g Mg turnings and stirred until a grey colored mixture was visible. This mixture was kept under an inert atmosphere. Then, a solution of 100 ml 14.2 vol. % chloromethyl triethoxysilane in dry THF was rapidly added to the mixture and stirred for 48 h at 50° C. The mixture was filtered off and the solvent was removed from the filtrate.

Pentane was added to the residue and this mixture was also filtered. The remaining oil consisted of cyclic carbon-bridged organosilanes of formula $[SiCH_2(OEt)_2]_3$ and $[SiCH_2]_3(OEt)_5CH_2Si(OEt)_3$.

Preparation of Organosilica Sealing Layer

For the deposition of the sealing layer, a sealing compound (solution) was prepared by ageing a precursor solution comprising cyclic carbon bridged organosilane precursors, water, hydrochloric acid and ethanol. This solution was aged for one week to allow oligomer formation as schematically illustrated in FIG. 1.

In a particular embodiment the solution comprising the oligomers was spin coated at 5000 rpm on the mesoporous silica film to form an organosilica dense top layer.

An additional baking step (thermal treatment) was performed at 400° C. under nitrogen atmosphere to remove all the volatiles and to complete the condensation of the cyclic carbon bridged precursor. In more details, 0.5 ml of the cyclic carbon-bridged organosilane mixture was dissolved in the 20 ml ethanol, 0.5 ml (0.1M) HCl and 0.5 ml $H_2O$ and aged for 1 week. The solution was then spin coated at 5000 rpm on top of the mesoporous silica film to form an organosilica sealing layer. An additional baking step was performed at 400° C. under nitrogen atmosphere to remove all the volatiles and to complete the condensation of the cyclic carbon bridged precursor.

In other examples different concentrations of the cyclic carbon-bridged organosilane mixture were tested between 0.25 ml to 5 ml precursor mixture for 20 ml ethanol. Ageing conditions were also varied from 12 h to 1 week at room temperature and for 90 min with reflux at high temperature (immediately below the boiling temperature of ethanol) to enhance oligomer formation.

Finally, the resulting film was vacuum dried before applying a treatment with hexamethyl disilazane (HMDS) to endcap the remaining silanol groups.

HDMS Treatment

The vacuum dried film was exposed to HMDS vapor for 2 h at 130° C. and rinsed with pentane to remove unreacted HMDS.

Ellipsometry for Evaluating the Total Porosity by Measuring the Refractive Index.

The refractive index and thickness of the layer was analyzed on a Woollam spectroscopic ellipsometer Sentech™ 801. This nondestructive method measures the change in polarization of the reflected light off a sample. By using a mathematical model, the thickness and refractive index were calculated. Knowing the refractive index it is possible to calculate the theoretical porosity by using the Lorentz-Lorenz equation:

$$\frac{n^2-1}{n^2+2} = V_p \frac{n_p^2-1}{n_p^2+2} + (1-V_p)\frac{n_s^2-1}{n_s^2+2} \quad (1)$$

Wherein $n_p$ stands for the refractive index of the material inside the pores (in this case air with $n_p=1$) and $n_s$ is the refractive index of the material containing the pores. By measuring n by ellipsometry, one can easily calculate the porosity $V_p$.

For the determination of the porosity and pore radius distribution, a spectroscopic ellipsometer Sentech™ 801 at 70° incidence angle is mounted in a vacuum chamber that can be filled with solvent vapor (toluene) in a controlled way. The pressure of the toluene vapors is raised in steps from the vacuum level up to the saturation pressure. The pressure dependent condensation occurs in the open pores and the refractive index of the sample is changed. The total pore volume is calculated from the change in refractive index using following equation.

$$P = \frac{\frac{n_{rf}^2-1}{n_{rf}^2+2} - \frac{n_{re}^2-1}{n_{re}^2+2}}{\left(\frac{n_{ads}^2-1}{n_{ads}^2+2}\right)} \quad (2)$$

Wherein P is the porosity, $n_{re}$ the refractive index of the film with empty pores, $n_{rf}$ the refractive index of the film with filled pores and $n_{ads}$ the refractive index of the solvent.

The pore radius is calculated from the desorption branch with the Kelvin equation taking into account the physical properties of toluene.

$$\ln\frac{P}{P_0} = \frac{-\gamma V}{rRT} \quad (3)$$

With $P/P_0$ the relative pressure, $\gamma$ the surface tension of toluene, V the molar volume of toluene, r the pore radius, R the gas constant and T the temperature.

FIG. 2 shows the toluene adsorption/desorption isotherms (left) of the schematically represented stacks (right): (a) porous material (2) on a substrate (1); (b) sealing layer according to the method of the disclosure (3) on the porous material (2) on a substrate (1); (c) post-treated (HDMS) sealing layer according to the method of the disclosure (3') on the porous material (2) on a substrate (1). In the isotherms of FIG. 2, "O.p." stands for "Open porosity".

While not wishing to be bound by theory, the interpretation of FIG. 2 is further discussed. The isotherm of the porous (silica) material shows a steep capillary condensation step with a H1 hysteresis which is typical for mesoporous materials with a uniform pore size distribution. In Table 1 can be seen that the open porosity is equal to the total porosity.

The isotherm of the sample after the organosilica layer deposition and baking shows a gradually increase in toluene adsorption instead of a steep capillary condensation step. This can be assigned to the fact that toluene cannot easily diffuse into the pores which is also confirmed by the delayed desorption of the toluene. These isotherms are typical for porous material containing cavities. Although the open porosity is still equal to the total porosity, the pore entrances are very narrow. Thus the sealing layer comprises very narrow pores (lower than or equal to 0.6 nm since toluene is still admitted) which makes the sealing layer a suitable protective layer for various porous materials having larger pores, such as mesoporous materials. Compared to the original silica film, the total porosity of the film after the organosilica sealing layer deposition and baking is only decreased with 4% and the thickness is increased with 20 nm (see Table 1). The little decrease in porosity is a proof that there is no significant diffusion of the sealing layer into the porous material and that a high porosity can be maintained after the deposition.

TABLE 1

| Sample | Thickness (nm) | $P_{tot}$ (v %) | $P_{open}$ (v %) | $P_{closed}$ (v %) | Contact angle (°) |
|---|---|---|---|---|---|
| (1) | 80 | 38 | 38 | 0 | 57 |
| (2) | 100 | 34 | 34 | 0 | 70 |
| (3) | 100 | 34 | 2.5 | 31.5 | 86 |

Table 1 provides physical properties of the mesoporous silica film as deposited (sample 1), after sealing layer deposition and baking (sample 2) and after HDMS treatment of sample 2 (sample 3).

Further, no changes in total porosity and thickness are observed after the HMDS treatment, while only the open porosity is decreased from 34% to 2.5%. This means that after HDMS treatment (3') about 93% of the pores of the as-deposited and baked material are completely sealed. Moreover, as can be seen from the isotherm of the HMDS treated film in FIG. 2 (c), toluene adsorption took place at high relative pressures which indicates that toluene did not diffuse into the pores, an indication for complete sealing of the pores. The limited adsorption can be attributed to condensation of the toluene at the surface of the already sealed film. After the organosilica sealing layer deposition, a completely sealed porous material was obtained. Further, a hydrophobic surface was obtained by the HDMS treatment as shown in the last column of Table 1 wherein the water contact angles are listed after each deposition step. Water contact angles values were obtained by using a Krüss-DSA 30 Drop Shape Analysis System.

The water contact angle increased after the HMDS treatment at about 86°.

Advantageously, a highly hydrophobic surface of the sealed film was obtained, in this way preventing subsequent moisture adsorption which can lead to degradation of the k-value.

Figure 3:
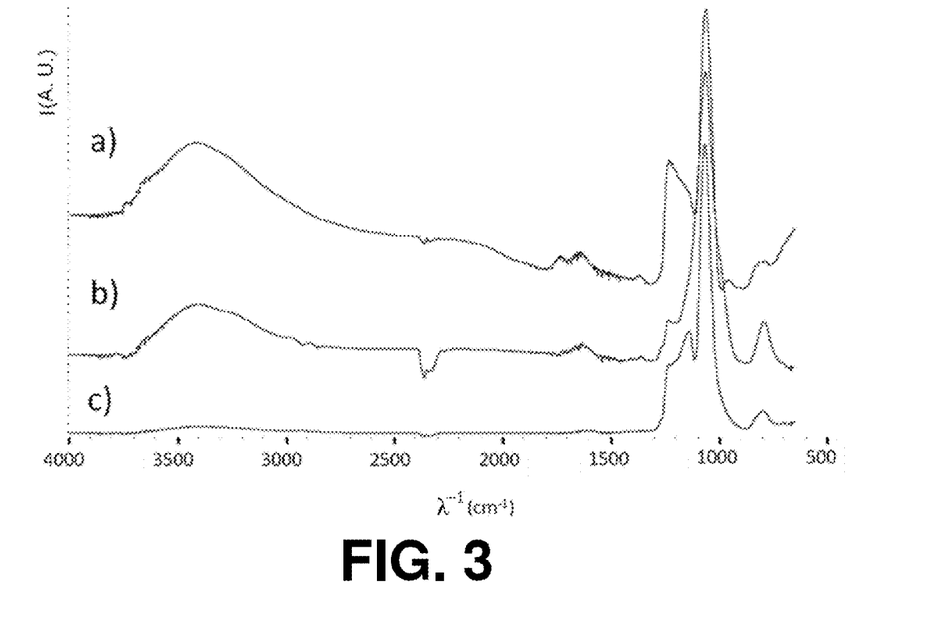
FIG. 3 shows the DRIFT spectrum of a) porous silica layer b) porous silica layer with sealing organosilica layer according to an embodiment of certain embodiments and c) porous silica layer with sealing organosilica layer, after HMDS treatment according to an embodiment.

The sealed porous material was characterized by Diffuse reflectance Fourier transform infrared spectroscopy (DRIFT) and the spectra are shown in FIG. 3. DRIFT spectra were obtained on a Nicolet™ 6700 FT-IR from Thermo Scientific.

Because the thickness of the deposited sealing layer is only 20 nm, the typical peaks of the carbon-hydrogen stretch vibrations around 2900 $cm^{-1}$ are not well resolved.

However, the broad band between 3200 and 3600 $cm^{-1}$, typical for physisorbed moisture is clearly visible for the porous silica layer (as deposited porous material). This band is less intense after the organosilica deposition (the sealed porous material), and almost completely disappears after the HMDS treatment, proving that a hydrophobic material is obtained.

Preparation of a Mesoporous Ethylene-Bridged Organosilica Film 1.2 g Brij™-76 (a polyoxyethylene stearyl ether porogen template) was dissolved in 20 ml ethanol and 1.5 ml (0.1M) HCl. Then, 3 ml of 1,2-bis(triethoxysilyl)ethane and 1.5 ml $H_2O$ were added to the solution and this was aged for 1 day. The solution was then spin coated on a Si-wafer at a rate of 5000 rpm. The porogen was removed by treating the film at 400° C. for 5 hours. The higher contact angle is due to the organic components in the matrix compared to the pure mesoporous silica film of example 1.

Determination of Dielectric Constant and Leakage Current in Partially Sealed Mesoporous Ethylene-Bridged Organosilica Films The dielectric constant and leakage current of mesoporous ethylene-bridged organosilica films (as prepared in example 6) and partially sealed mesoporous ethylene-bridged organosilica films with a porosity around 40% (obtained by preparing and depositing a sealing layer as described in example 3) were determined and compared.

The porosities, contact angles and dielectric constants are given in table 2.

TABLE 2

| Sample | Porosity (%) | Contact angle (°) | k-value |
| --- | --- | --- | --- |
| OS | 38 | 68 | 2.5 |
| PSOS | 41.5 | 71 | 2.07 |

Table 2 provides porosity, water contact angle and k-value of partially sealed (PSOS) and non-sealed (OS) mesoporous ethylene-bridged organosilica films.

Figure 4:
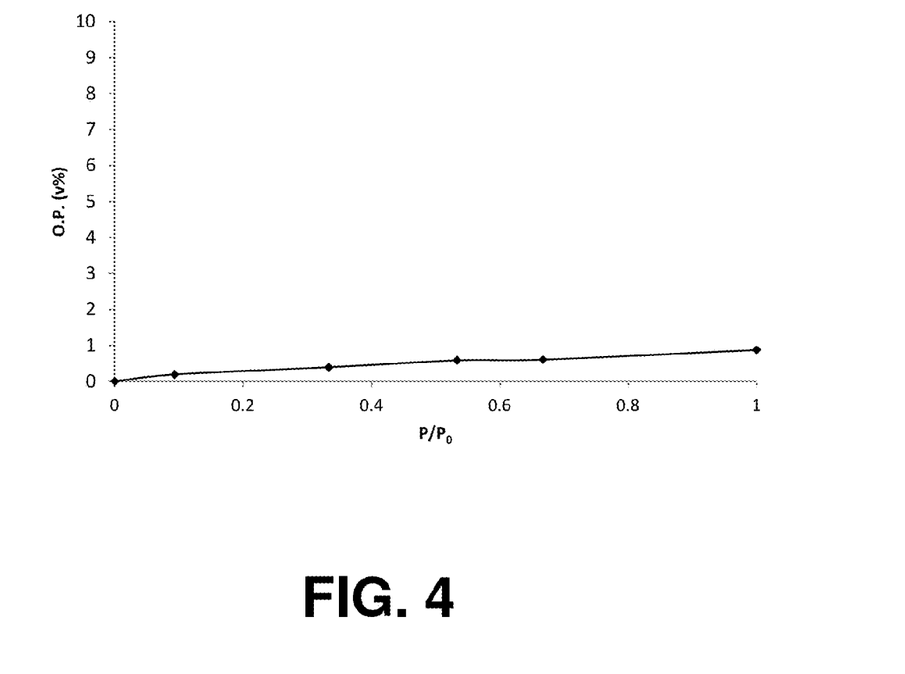
FIG. 4 shows the water adsorption isotherm of a partially sealed mesoporous ethylene-bridged organosilica films according to an embodiment.

It can be seen from Table 2 that the lowest k-value is obtained for sample PSOS. This is because the higher k-value of OS can be attributed to adsorbed moisture which is also confirmed by the lowest contact angle for the OS film. However, the contact angle of sample PSOS is also not very high although the k-value is in this case very low. This assumes that the top layer even without extra HMDS treatment is sufficient to block moisture. To confirm this, a water adsorption measurement was performed on PSOS and the result is presented in FIG. 4. It can be seen that no significant amount of water is adsorbed.

Figure 5:
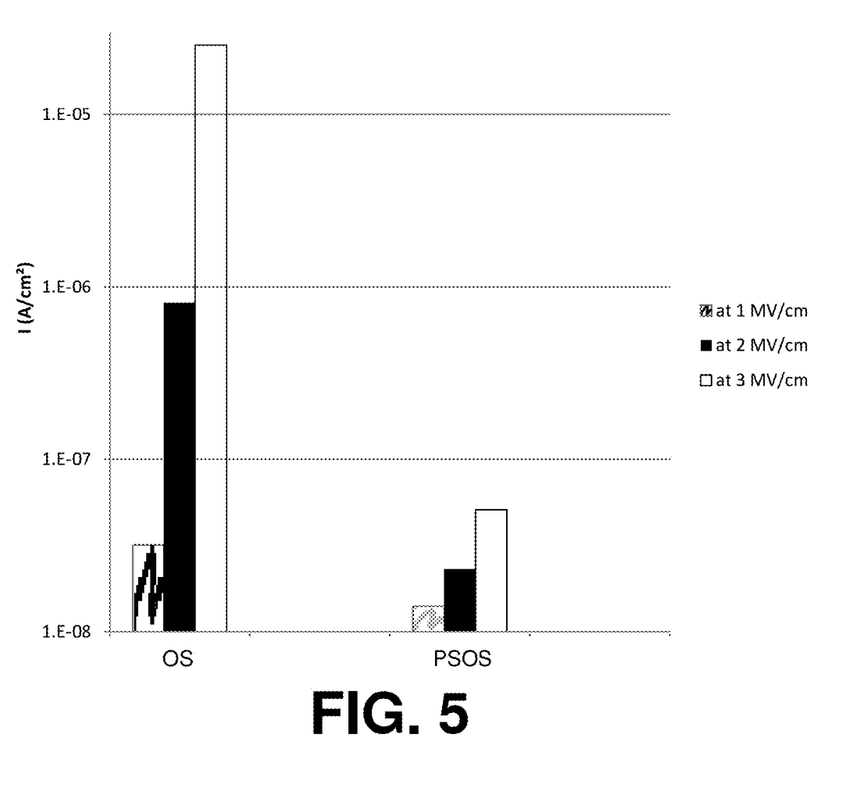
FIG. 5 shows the leakage current measurements at different applied voltages of (right side) partially sealed mesoporous ethylene-bridged organosilica films according to an embodiment of certain embodiments and (left side) non-sealed mesoporous ethylene-bridged organosilica films.

The leakage current at several voltages is given in FIG. 5. Similar as for the k-value, the leakage current of the OS film was the worst which was also due to the less hydrophobic character of the film. It increased quite rapidly when the voltage was raised. The best result was again obtained for the partially sealed porous film. At low voltage it had a sufficient low-leakage current and even at 3 MV/cm, the leakage current was in the same order as at 1 MV/cm.

Compatibility of the Sealing Layer with Semiconductor Manufacturing.

Because diffusion of the sealant into the porous material is an issue in semiconductor manufacturing, possible diffusion of the top layer was first investigated with ellipsometry. Therefore the thickness and refractive index of the pristine porous silica film was determined using the Cauchy model.

Next, the sealing layer was deposited on top of the porous silica and the total thickness (porous silica+top layer) was determined. By knowing the thickness of the porous film and the total thickness, the thickness of the top layer can be calculated. To know the refractive index (and thus the porosity) of the porous silica film after the dense layer deposition, a 2 layer Cauchy model was used. One layer model fits the porous film and the other the top film. Assuming that the thickness of the porous film does not change significantly after the top layer deposition, this parameter can be fixed and only the parameters that influence the refractive index are fitted. In the case that the refractive index of the porous film is similar before and after the top layer deposition, there is no significant diffusion of the top layer.

Figure 6:
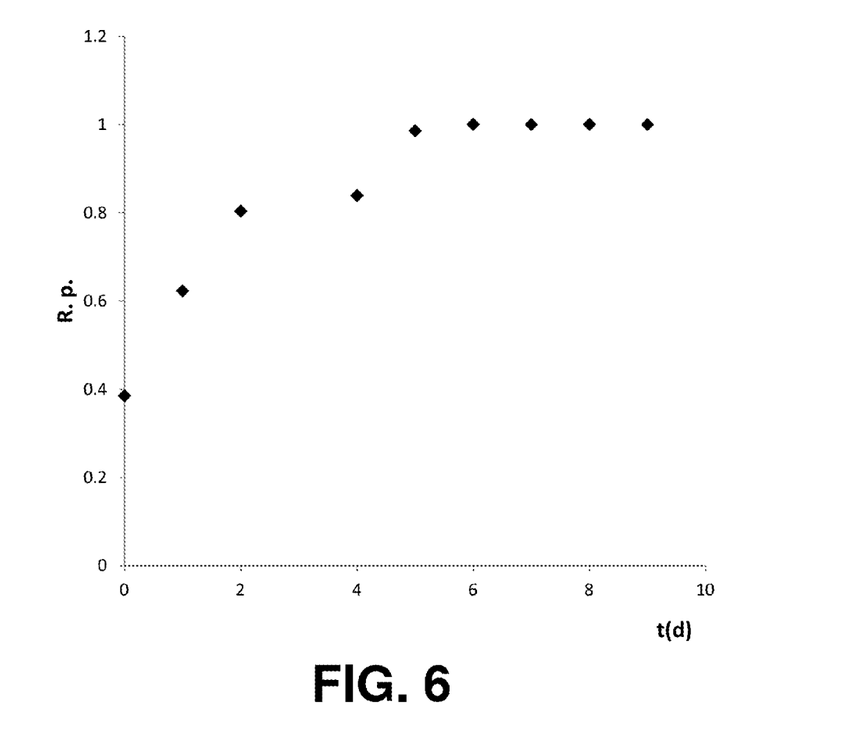
FIG. 6 is a graph plotting the relative porosity as a function of ageing time of mesoporous silica films after deposition of a top layer according to an embodiment.

In order to determine whether the ageing time leads to large oligomers that can exceed the pore size, the sealant solution was spin-coated every 24 hours on porous silica samples with pore sizes around 3 nm. The results are shown in FIG. 6. Due to the fact that the porosity of the different porous silica samples was not exactly the same, the relative porosity (R. p.) (ratio porosity after/before deposition) was plotted in function of the aging time in days (t(d)).

It can be seen from the figure that before 5 days the porosity of the silica film after deposition is lower than the pristine one. This means that the sealant molecules are not large enough and will diffuse in the porous material, filling up the pores. After 5 days of aging the porosity of the porous films does not change, meaning that the sealant molecules are too large to enter the pores.

Accelerated Ageing

Figure 7:
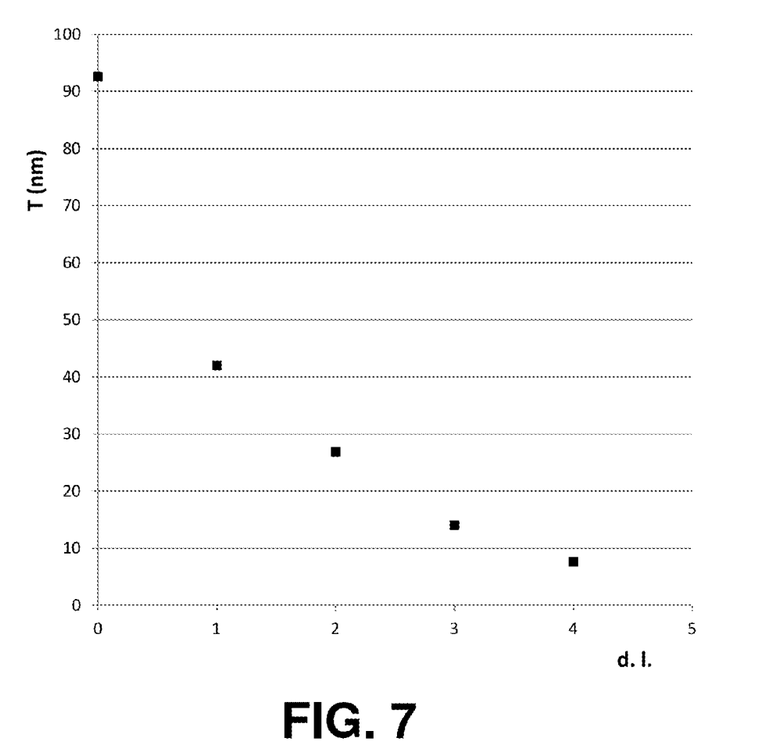
FIG. 7 is a graph plotting the thickness of sealant layer as a function of the precursor dilution level according to an embodiment.

The prepared precursor solution of example 2 (not yet aged) was boiled to evaporate ethanol until the solution color changed from transparent to yellow and a high viscous liquid was obtained, indicating that condensation reactions took place (common sol-gel chemistry). Next, the highly viscous liquid was boiled for an additional 10 minutes. Next, ethanol was added again to obtain the original solution volume (dilution level d.l. 0) and the solution was further diluted (10, 100, 1000, or 10000 times corresponding to a dilution level of 1, 2, 3 and 4 respectively) with ethanol to control the thickness (T) of the layer and speed-up oligomer formation. The influence of the ethanol concentration on the thickness (T) is shown in FIG. 7. It can be seen that after every dilution step the thickness of the layer is more or less divided by two. Further, confirmation of the oligomer formation is that at dilution level 0, the thickness of the sealant layer is much higher than when the pristine starting solution is deposited (90 vs. 20-40 nm). Also with this dilution approach very thin layers can be obtained (<10 nm)

Figure 8:
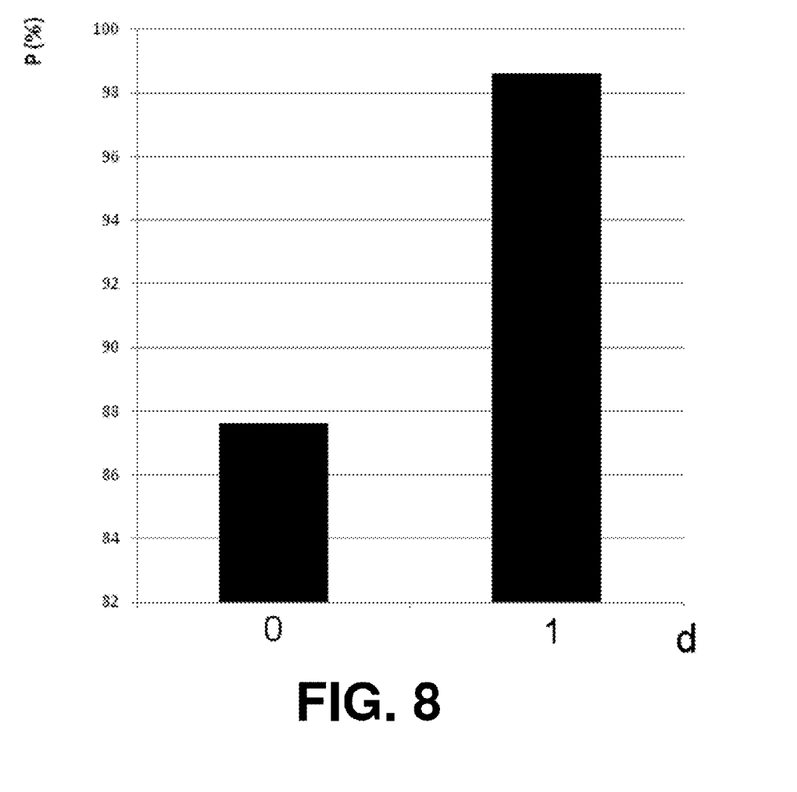
FIG. 8 shows the porosity of porous films after top layer deposition as a function of the ageing time before deposition according to an embodiment.

To investigate if the ageing time needed to avoid diffusion is decreased with this method. The level 1 diluted solution was deposited on a porous silica material and the remaining porosity of this layer was determined with ellipsometry. When the solution was deposited 90 minutes after dilution (day (d) 0), there is only a slight diffusion of the precursors into the porous material, this is evidenced by the fact that almost 90% of the original porosity is remained (FIG. 8). After 1 day (d) of ageing, the remaining porosity is very close to 100% of the original value. This means that the ageing time can be drastically reduced.

End-Capping of Silanol Groups with the Sealant Precursor Itself

Figure 9:
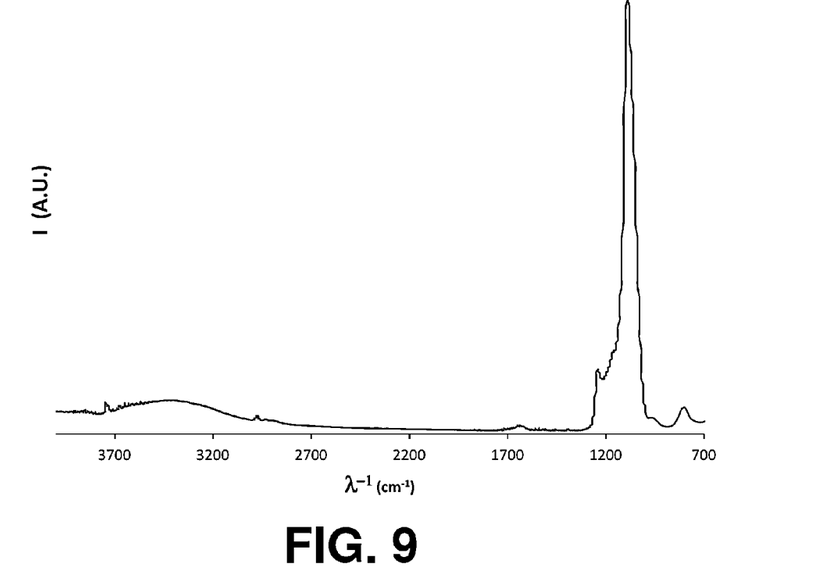
FIG. 9 is the FTIR spectrum of a porous silica powder end-capped with a sealant precursor disclosed as a proof of concept for another embodiment.
Figure 10:
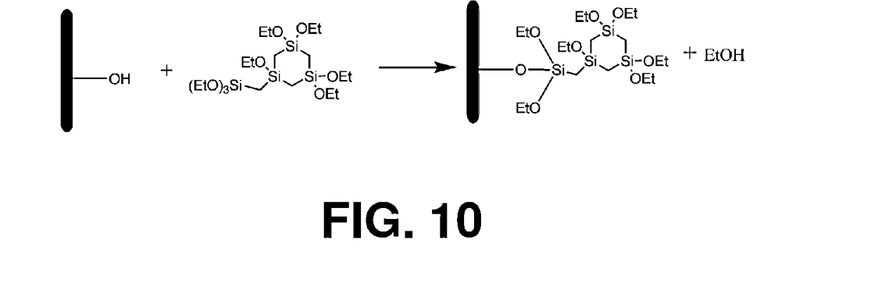
FIG. 10 illustrates the end-capping reaction of a silane precursor with silanols of a sealing layer according to an embodiment.
Figure 11:
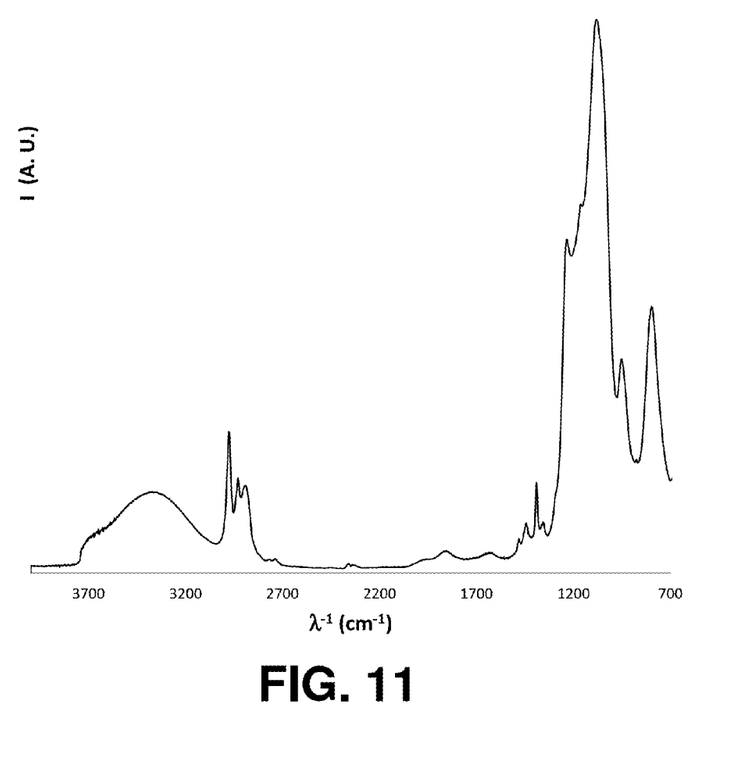
FIG. 11 shows the FTIR spectrum of a porous silica powder after end-capping with a cyclic organosilane precursor disclosed as a proof of concept for another embodiment.

It was previously mentioned herein that a fourth illustrative group of suitable silanol end-capping compounds comprising hydrophobic groups are cyclic carbon bridged organosilica as defined for the precursor solution of any embodiment. As a proof of concept grafting was applied on mesoporous silica powder, the material was characterized with FTIR spectroscopy. The FTIR spectrum in FIG. 9 shows a typical spectrum for silica materials. At 1150 $cm^{-1}$ the Si—O—Si peak is clearly visible and the peak at 3750 $cm^{-1}$ can be assigned to the free silanol groups. The end-capping follows the reaction given in FIG. 10. The silanols of the material react with the Si centers of the silane precursor and ethanol comes free. Proof for this reaction is given by the DRIFT spectrum shown in FIG. 11. The peak of the free silanols disappeared and C—H stretch vibrations of the organosilanes are clearly visible around 2970 $cm^{-1}$ as well as C—H bend vibrations around 1400 $cm^{-1}$.

Direct Deposition of Tantalum Nitride Tan onto an at Least Partially Sealed Porous Film.

Approximately 7 nm TaN was sputtered on a partially sealed mesoporous silica film described hereinabove. Focused Ion Beam (FIB) cutting was applied to obtain cross-sections of the film, which were examined with high resolution transmission electron microscopy (HRTEM). TEM images clearly show that a really sharp interface is present between the TaN layer and the cyclic carbon-bridged layer, thus proving its perfect sealing property. This proves that the partial sealing realized after deposition of the organosilica layer without extra HDMS treatment is already sufficient for the deposition of copper barrier layers in actual semiconductor device applications.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A semiconductor device comprising:
   a semiconductor substrate comprising a porous material having pores with a dimension from 2 nm to 50 nm, the semiconductor substrate having, in the porous material, an interconnect structure comprising at least one trench or via, wherein surfaces of the at least one trench or via comprise the porous material;
   a sealing layer overlying and in physical contact with the surfaces of the at least one trench or via comprising the porous material, wherein the sealing layer comprises oligomers with at least one of a cyclic carbon bridged organosilica or a bridged organosilane structure and with pores having a dimension not greater than 0.6 nm;
   a barrier layer atop the sealing layer in the at least one trench or via; and
   an electrically conductive material filling the remaining volume of the at least one trench or via, wherein the barrier layer is configured to prevent diffusion of the electrically conductive material into the porous material, wherein the sealing layer is configured to act as a barrier between material of the barrier layer and the porous material.

2. The semiconductor device of claim 1, wherein the sealing layer has a k value of between 1.8 and 3.6.

3. The semiconductor device of claim 1, wherein the sealing layer comprises functional groups blocking the pores, wherein the functional groups are obtained by end-capping silanol groups using an end-capping compound comprising hydrophobic moieties.

4. The semiconductor device of claim 3, wherein the end-capping compound is selected from the group consisting of:
   compounds represented by a structural formula $R_nSiX_{4-n}$, wherein n is from 1 to 3 when X is not OR' and wherein n is from 0 to 3 when X is OR', wherein each R and R' is independently selected from the group consisting of saturated hydrocarbyl groups and aromatic hydrocarbyl groups, and wherein each X is independently a group capable of reaction with a silanol group;
   compounds represented by a structural formula $R'_3SiR''SiR'''_3$ wherein each R'' is independently selected from the group consisting of a $C_{1-4}$ alkylene group or an arylene divalent group, and wherein each R''' is independently selected from the group consisting of a $C_{1-4}$ alkyl and a $C_{1-4}$ alkoxy; and
   compounds represented by a structural formula $R_3Si$—$NH$—$SiR_3$ or cyclic compounds of the structural formula $[SiR_2NH]_3$ wherein each R is independently selected from the group consisting of saturated hydrocarbyl groups and aromatic hydrocarbyl groups.

5. The semiconductor device of claim 1, wherein the electrically conducting filling material is copper.

6. The semiconductor device of claim 5, wherein the material of the barrier layer is selected from the group consisting of tantalum, tantalum nitride, and combinations thereof.

7. A method for forming a semiconductor device of claim 1 comprising:
   providing a semiconductor substrate comprising a porous material having pores with a dimension from 2 nm to 50 nm, the semiconductor substrate having, in the porous material, an interconnect structure comprising at least one trench or via, wherein surfaces of the at least one trench or via comprise the porous material;
   forming a sealing layer with pores having a dimension not greater than 0.6 nm, the sealing layer overlying and in physical contact with the surfaces of the at least one trench or via comprising the porous material, by applying a sealing compound comprising oligomers, wherein the oligomers are formed by ageing a precursor solution comprising at least one member selected from the group consisting of cyclic carbon bridged organosilica, bridged organosilanes, and combinations thereof;
   providing a barrier layer on the sealing layer in the at least one trench or via;
   filling the remaining volume of the at least one trench or via with an electrically conductive material;
   wherein the barrier layer is configured to prevent diffusion of the electrically conductive material into the porous material, wherein the sealing layer is configured to act as a barrier between material of the barrier layer and the porous material.

8. The method according to claim 7, wherein the porous material is a low-k dielectric material.

9. The method according to claim 7, wherein the cyclic carbon bridged organosilica is selected from the group consisting of tri-silacyclohexanes, [SiCH$_2$(OEt)$_2$]$_3$, [SiCH$_2$]$_3$(OEt)$_5$CH$_2$Si(OEt)$_3$, and combinations thereof.

10. The method according to claim 7, wherein the bridged organosilanes are represented by a structural formula (EtO)$_3$SiRSi(OEt)$_3$, wherein R is a divalent group selected from the group consisting of CH$_2$, CH$_2$CH$_2$, CH=CH and phenylene.

11. The method according to claim 7, wherein the porous material and sealing layer together comprise an assembly of layers, the method further comprising submitting the assembly of layers to a thermal treatment.

12. The method according to claim 7, wherein the sealing compound is applied by a spin-on technique.

13. The method according to claim 7, wherein the precursor solution further comprises at least one member selected from the group consisting of water, an acid, and a solvent.

14. The method according to claim 7, wherein the sealing compound exhibits a viscosity of between 1 cP and 3 cP.

15. The method according to claim 7, wherein ageing a precursor solution comprises ageing a precursor solution for least 90 minutes.

16. The method according to claim 7, wherein the porous material and sealing layer together comprise an assembly of layers, the method further comprising post-treating the assembly of layers to make the sealing layer more hydrophobic.

17. The method according to claim 16, wherein post-treating comprises exposing the assembly of layers to an end-capping compound comprising hydrophobic groups.

18. The method according to claim 16, wherein the end-capping compound comprising hydrophobic groups is selected from the group consisting of:
 compounds represented by a structural formula R$_n$SiX$_{4-n}$, wherein n is from 1 to 3 when X is not OR' and wherein n is from 0 to 3 when X is OR', wherein each R and R' is independently selected from the group consisting of saturated hydrocarbyl groups and aromatic hydrocarbyl groups, and wherein each X is independently a group capable of reaction with a silanol group;
 compounds represented by a structural formula R'$_3$SiR''SiR'''$_3$ wherein each R'' is independently selected from the group consisting of a C$_{1-4}$ alkylene group or an arylene divalent group, and wherein each R''' is independently selected from the group consisting of a C$_{1-4}$ alkyl and a C$_{1-4}$ alkoxy; and
 compounds represented by a structural formula R$_3$Si—NH—SiR$_3$ or cyclic compounds of the structural formula [SiR$_2$NH]$_3$ wherein each R is independently selected from the group consisting of saturated hydrocarbyl groups and aromatic hydrocarbyl groups.

19. The method according to claim 7, further comprising applying a post-treatment after forming the sealing layer on the porous material, wherein the post-treatment creates hydroxyl groups on the surface of the sealing layer, and thereafter conducting an atomic layer deposition atop the at least partially sealed porous material.

* * * * *